(12) United States Patent
Shuto

(10) Patent No.: US 8,860,103 B2
(45) Date of Patent: Oct. 14, 2014

(54) SEMICONDUCTOR MEMORY DEVICE

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 369 days.

(21) Appl. No.: 13/230,755

(22) Filed: Sep. 12, 2011

(65) Prior Publication Data
US 2012/0153414 A1 Jun. 21, 2012

(30) Foreign Application Priority Data

Dec. 17, 2010 (JP) .................................. 2010-281947

(51) Int. Cl.
H01L 29/06 (2006.01)
H01L 47/00 (2006.01)
G11C 11/00 (2006.01)
H01L 27/22 (2006.01)
H01L 21/02 (2006.01)

(52) U.S. Cl.
CPC .................... H01L 27/228 (2013.01)
USPC ......... 257/295; 257/5; 257/E27.104; 365/158

(58) Field of Classification Search
CPC .. H01L 27/0207; H01L 27/228; G11C 11/16; G11C 11/161; G11C 7/18; G11C 5/025; G11C 5/06; G11C 5/08; G11C 2213/79
USPC ........... 257/5, 295, E27.104; 365/63, 69, 158
See application file for complete search history.

(56) References Cited

U.S. PATENT DOCUMENTS

| 7,457,150 B2 | 11/2008 | Tsuchida et al. | |
| 7,505,307 B2* | 3/2009 | Ueda | 365/158 |
| 8,111,540 B2* | 2/2012 | Asao et al. | 365/148 |
| 8,174,874 B2* | 5/2012 | Inaba | 365/158 |
| 8,208,292 B2* | 6/2012 | Kai et al. | 365/158 |
| 2007/0279963 A1* | 12/2007 | Tsuchida et al. | 365/148 |
| 2008/0239782 A1* | 10/2008 | Asao | 365/63 |
| 2010/0103718 A1* | 4/2010 | Asao et al. | 365/148 |
| 2011/0069534 A1* | 3/2011 | Inaba | 365/158 |
| 2012/0063216 A1* | 3/2012 | Fujita et al. | 365/158 |

FOREIGN PATENT DOCUMENTS

JP 2007-317795 12/2007

OTHER PUBLICATIONS

M. Hosomi, et al., A Novel Nonvolatile Memory with Spin Torque Transfer Magnetization Switching: Spin-RAM (IEEE 2005).
K. Tsuchida et al., ISSCC 2010/Session 14/Non-Volatile Memory/ 14.2—A 64Mb MRAM with Clamped-Reference and Adequate-Reference Schemes.

* cited by examiner

Primary Examiner — Cheung Lee
Assistant Examiner — Jeremy Joy
(74) Attorney, Agent, or Firm — Knobbe, Martens, Olson & Bear, LLP

(57) ABSTRACT

A semiconductor memory device according to an embodiment includes: a plurality of magnetic tunnel junction elements arranged on a semiconductor substrate; and a plurality of selection transistors electrically connected to first ends of the plurality of magnetic tunnel junction elements. A plurality of first bit lines are respectively connected to the first ends of the magnetic tunnel junction elements via one or more of the selection transistors. A plurality of upper electrodes are respectively connected to second ends of the plurality of magnetic tunnel junction elements. A plurality of second bit lines are respectively connected to the second ends of the magnetic tunnel junction elements via the upper electrodes. The upper electrodes extend along the second bit lines, and one of the upper electrodes is commonly connected to the second ends of the plurality of magnetic tunnel junction elements arranged in an extending direction of the second bit lines.

17 Claims, 11 Drawing Sheets

SEMICONDUCTOR MEMORY DEVICE

CROSS REFERENCE TO RELATED APPLICATIONS

This application is based upon and claims the benefit of priority from the prior Japanese Patent Application No. 2010-281947, filed on Dec. 17, 2010, the entire contents of which are incorporated herein by reference.

FIELD

The embodiments of the present application relate to a semiconductor memory device.

BACKGROUND

As resistance change type elements for storing data using a change in resistance of elements, magnetic random access memories (MRAMs) have been developed. A current is caused to flow through magnetic tunnel junction (MTJ) elements to thereby write data into the MTJ elements.

One end of each MTJ element is connected to a corresponding first bit line via a corresponding selection transistor, and another end of each MTJ element is connected to a corresponding second bit line via a corresponding upper electrode. Each upper electrode is typically connected to a corresponding second bit line via a single via contact.

To cause a sufficient write current to flow through MTJ elements, a plurality of selection transistors may be provided to respectively correspond to the MTJ elements. In this case, a large current flows through via contacts between the upper electrodes and the second bit lines during data write operation. Each upper electrode is commonly connected to two MTJ elements neighboring in the word line direction in some cases. In such cases, the current flowing through the via contacts further increases.

If the current is concentrated on the via contacts, metal materials constituting the via contacts may deteriorate due to electromigration. The deterioration of the via contacts causes lowering of the reliability of a semiconductor memory device.

DETAILED DESCRIPTION

A semiconductor memory device according to an embodiment of the present invention includes: a plurality of magnetic tunnel junction elements arranged on a semiconductor substrate; and a plurality of selection transistors electrically connected to first ends of the plurality of magnetic tunnel junction elements. A plurality of first bit lines are respectively connected to the first ends of the magnetic tunnel junction elements via one or more of the selection transistors. A plurality of upper electrodes are respectively connected to second ends of the plurality of magnetic tunnel junction elements. A plurality of second bit lines are respectively connected to the second ends of the magnetic tunnel junction elements via the upper electrodes. The upper electrodes extend along the second bit lines, and one of the upper electrodes is commonly connected to the second ends of the plurality of magnetic tunnel junction elements arranged in an extending direction of the second bit lines.

Embodiments will now be explained with reference to the accompanying drawings.

First Embodiment

Figure 1:
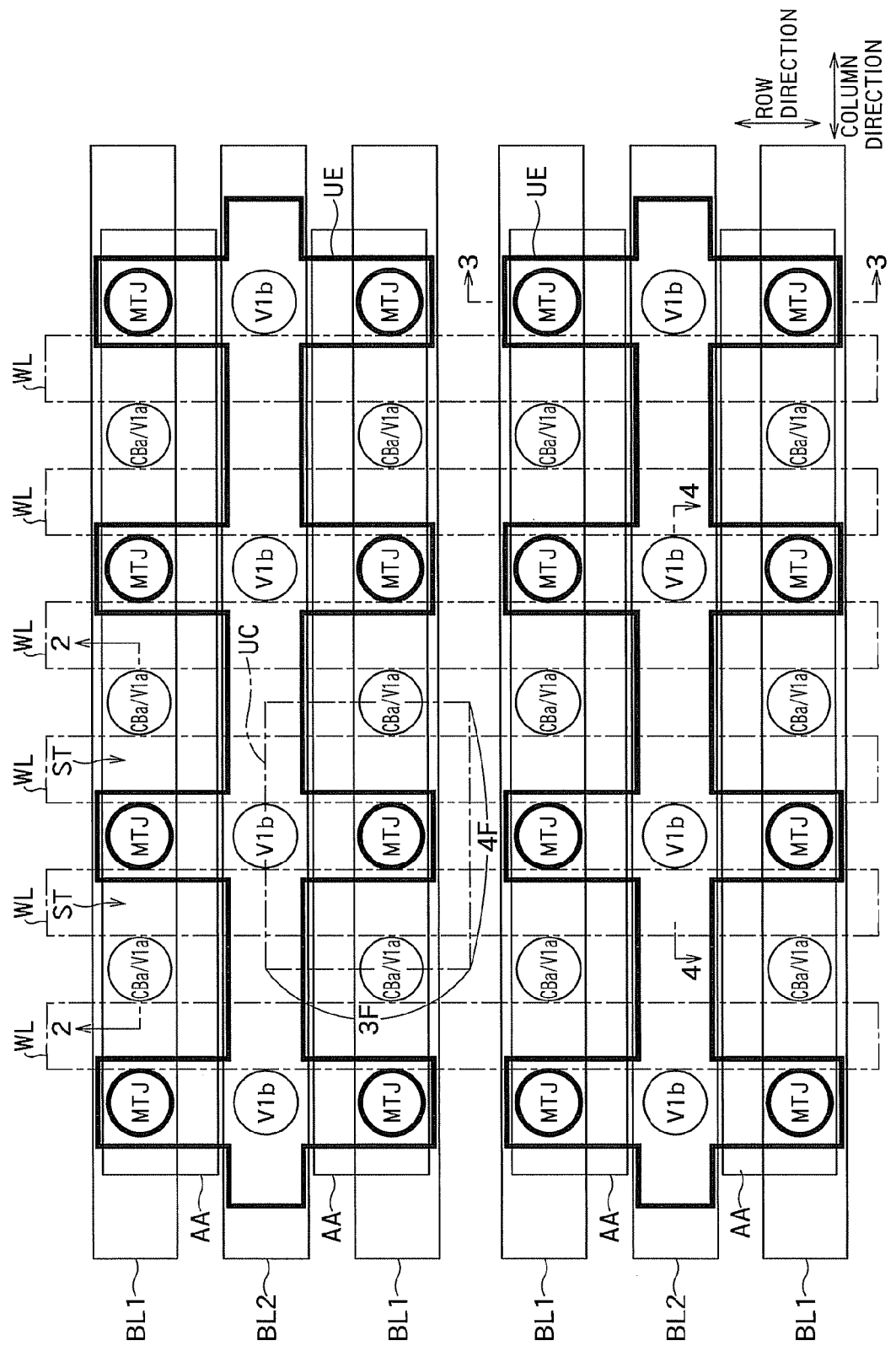
FIG. 1 is a partial plan view of a memory cell array of an MRAM according to a first embodiment.
Figure 2:
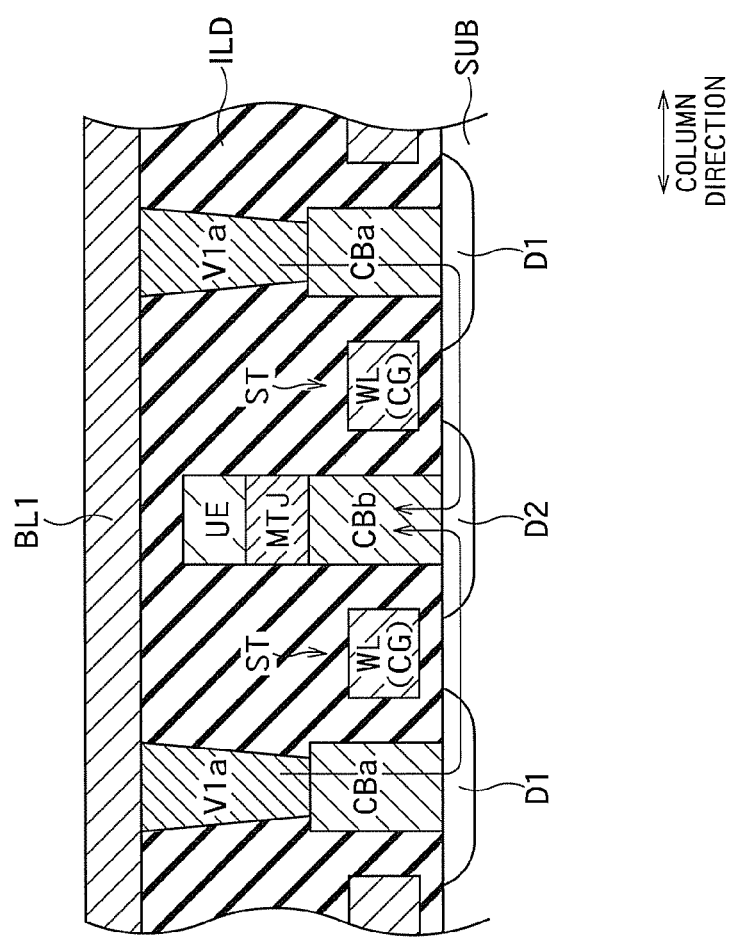
FIG. 2 is a sectional view taken along the line 2-2 of FIG. 1.
Figure 3:
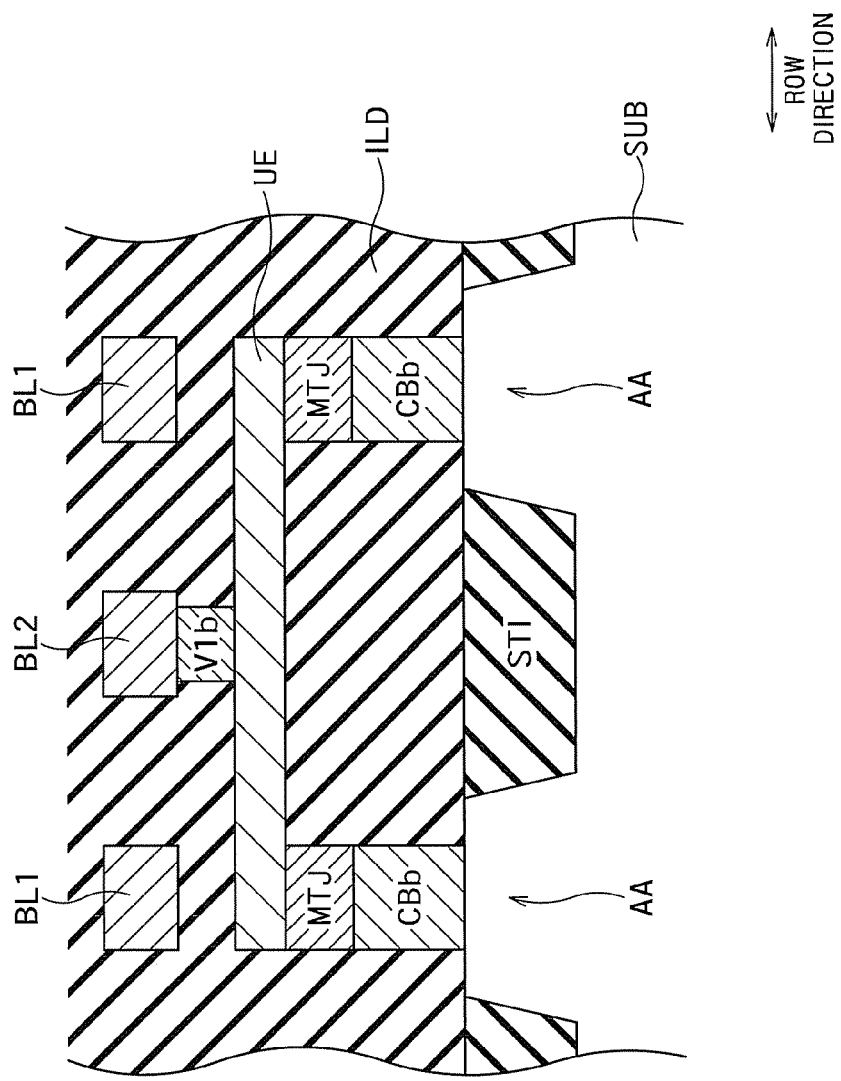
FIG. 3 is a sectional view taken along the line 3-3 of FIG. 1.
Figure 4:
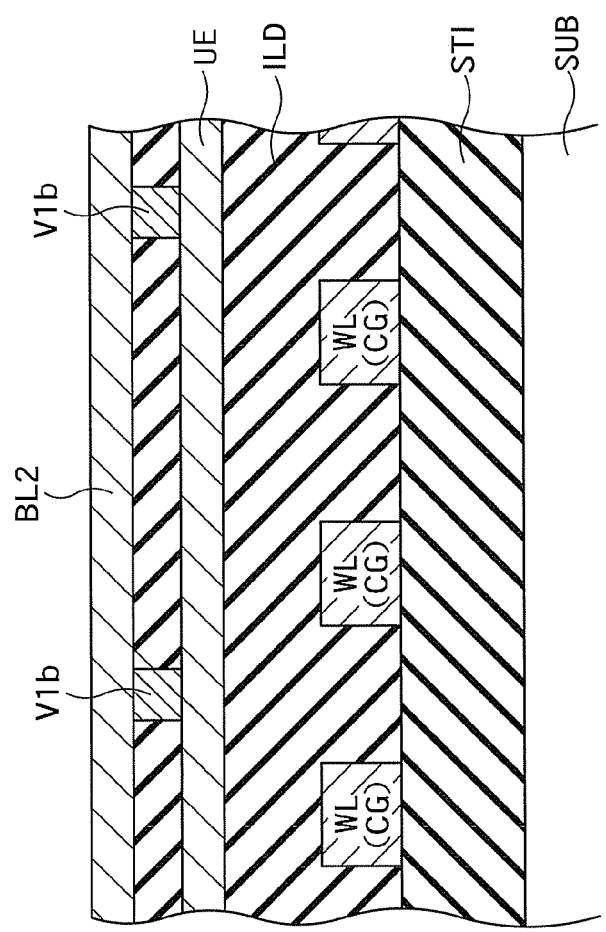
FIG. 4 is a sectional view taken along the line 4-4 of FIG. 1.

FIG. 1 is a partial plan view of a memory cell array of an MRAM according to a first embodiment. FIG. 2 is a sectional view taken along the line 2-2 of FIG. 1. FIG. 3 is a sectional view taken along the line 3-3 of FIG. 1. FIG. 4 is a sectional view taken along the line 4-4 of FIG. 1.

The MRAM according to the first embodiment is a spin injection write type MRAM. Typically, methods for writing data into MRAMs are divided into a magnetic field write method and a spin injection write method. In the magnetic field write method, when the size of each magnetic tunnel junction element (MTJ element) is reduced, a coercive force increases. As a result, a write current tends to increase. On the other hand, the spin injection write method uses a spin transfer torque (STT) write method. Accordingly, as the size of a magnetic material decreases, a spin injection current necessary for flux reversal decreases. Therefore, MTJ elements employing the spin injection write method are advantageous in terms of higher integration, lower power consumption, and enhanced performance. Meanwhile, in the magnetic field write method, erroneous writing into a non-selected memory cell may be caused due to spreading of a magnetic field. In the spin injection write method, however, such erroneous writing into a non-selected memory cell does not occur.

As shown in FIG. 1, a plurality of word lines WL extend in a row direction. First bit lines BL1 and second bit lines BL2 extend in a column direction. The first bit lines BL1 and the second bit lines BL2 extend in parallel with each other and are orthogonal to the word lines WL. Each of the second bit lines BL2 is provided to correspond to two first bit lines BL1 and is disposed between every two first bit lines BL1. The first bit lines BL1 are provided above MTJ elements and are provided on contacts CBa/V1a. The second bit lines BL2 are provided on via contacts V1b. The first bit lines BL1 are not in direct contact with the MTJ elements, and are connected to selection transistors ST via the contacts CBa/V1a. The second bit lines BL2 are connected to upper electrodes UE via the via contacts V1b. That is, in the first embodiment, the upper electrodes UE also function as local interconnections. In other words, the upper electrodes UE are also called local interconnections. In the plan view of FIG. 1, the positions of contact plugs CBa and via contacts V1a are represented by "CBa/V1a".

The MTJ elements, which are magnetic tunnel junction elements, are two-dimensionally arranged in a matrix form on a semiconductor substrate SUB. As shown in FIG. 2, two selection transistors ST neighboring in the column direction are provided to correspond to one MTJ element. These two selection transistors ST simultaneously operate to allow a write current from the first bit lines BL1 to flow through the corresponding MTJ element. That is, in the first embodiment, one memory cell is composed of one MTJ element and two selection transistors ST. During data write operation, two word lines WL corresponding to a selected memory cell are driven to render two selection transistors ST conductive. This allows the two selection transistors ST to supply the MTJ element with a sufficient current for writing data.

As shown in FIG. 1, in the first embodiment, one memory cell (unit cell UC) has a layout area of $12F^2$ (4F×3F). F represents a feature size which is a minimum processing dimension in a semiconductor production process. If one selection transistor ST can supply the corresponding MTJ element with a sufficient current for writing data, each memory cell may be composed of one selection transistor ST and one MTJ element. This allows a reduction in the area of the unit cell UC.

As shown in FIG. 2, each selection transistor ST is formed on the semiconductor substrate SUB. A first diffusion layer D1 of each selection transistor ST is connected to the corresponding first bit line BL1 via the corresponding contact plug CBa and the corresponding via contact V1a. A second diffusion layer D2 of each selection transistor ST is connected to a lower end (lower electrode) of the corresponding MTJ element via the corresponding contact plug CBb. That is, each first bit line BL1 is electrically connected to the lower end of the corresponding MTJ element via two selection transistors ST neighboring in the column direction. In the plan view of FIG. 1, each selection transistors ST is provided between each of the contacts CBa/V1a and each of the MTJ elements.

The upper electrodes UE are provided on the MTJ elements. As shown in FIGS. 1 and 3, the upper electrodes UE are connected to upper ends of two MTJ elements neighboring in the row direction. In addition, as shown in FIGS. 1 and 4, the upper electrodes UE extend in the column direction along the second bit lines BL2 below the second bit lines BL2. Further, the upper electrodes UE are commonly connected to the upper ends of a plurality of MTJ elements arranged in an extending direction (column direction) of the second bit lines BL2. The second bit lines BL2 are electrically connected to the upper electrodes UE via the via contacts V1b. As shown in FIGS. 1 and 3, each via contact V1b is shared by two MTJ elements between the two adjacent MTJ elements neighboring in the row direction. In addition, as shown in FIGS. 1 and 4, each via contact V1b is arranged in the column direction below the second bit lines BL2, and is provided between adjacent two word lines WL. That is, in the first embodiment, the upper electrodes UE are formed in a comb shape. Further, each of the upper electrodes UE is shared by all the MTJ elements which are arranged below two first bit lines BL1 corresponding to the second bit line BL2 connected to the corresponding upper electrode UE.

The word lines WL function not only as word lines but also as gate electrodes CG of the selection transistors ST. Alternatively, the gate electrodes CG of the selection transistors ST may be separately provided, and the word lines WL may be formed so as to be electrically connected to the gate electrodes CG in a layer different from that of the gate electrodes CG.

Each first bit line BL1 is electrically connected to a lower end of the corresponding MTJ element through the corresponding via contact V1a, the corresponding selection transistor ST, and the corresponding contact plug CBb. Each second bit line BL2 is electrically connected to an upper end of the corresponding MTJ element through the corresponding via contact V1b and the corresponding upper electrode UE. That is, each MTJ element and each selection transistors ST are connected in series between each first bit line BL1 and each second bit line BL2.

The via contacts V1b between the second bit lines BL2 and the upper electrodes UE shown in FIG. 4 are formed in the same process as that of the via contacts V1a between the first bit lines BL1 and the contact plugs CBa shown in FIG. 2. However, the via contacts V1a are formed at positions deeper than the via contacts V1b. Thus, during formation of the via contacts V1a and V1b, the upper electrodes UE function as etching stoppers.

As shown in FIG. 3, the first bit lines BL1 and the MTJ elements are formed above active areas AA which extend in the column direction. The selection transistors ST are also formed on the active area AA. On the other hand, the second bit lines BL are formed above an element isolation region STI (Shallow Trench Isolation) between the adjacent active areas AA. Accordingly, the first bit lines BL1 and the second bit lines BL2 can be formed in the same metal wiring layer (M1).

During data write operation, a pair of two word lines WL provided on both sides of a selected MTJ element are driven to render two selection transistors ST corresponding to the two word lines WL conductive. This allows a write current to flow through the selected MTJ element between the two selection transistors ST, thereby selectively writing data into current elements of the MTJ element.

Each pair of word lines WL provided on both sides of each non-selected MTJ element remain in a non-active state. Accordingly, the write current does not flow through the non-selected MTJ elements, so that no data is written into the non-selected MTJ elements.

The write current is fed to the selection transistors ST via the contacts CBa/V1a from the first bit lines BL1, and is further supplied to the MTJ elements via the selection transistors ST. The write current passing through the MTJ elements flows through the second bit lines BL2 via the upper electrodes UE and the via contacts V1b. This allows the write current to flow through the MTJ elements.

In the MRAM according to the first embodiment, as shown in FIG. 1, each of the upper electrodes UE is commonly connected to two MTJ elements neighboring in the row direction. In addition, like the second bit lines BL2, each of the upper electrodes UE extends in the column direction and is commonly connected to the plurality of MTJ elements neighboring in the column direction. As a result, the upper electrodes UE and the second bit lines BL2 are connected via the plurality of via contacts V1b which are arranged in the column direction. Accordingly, the resistance between each upper electrode UE and each second bit line BL2 decreases, and the write current flows from the upper electrodes UE to the second bit lines BL2 via the plurality of via contacts V1b. That is, the write current flows through the plurality of via contact V1b in a dispersed manner, thereby preventing the write current from being concentrated on the local via contacts V1b. Consequently, it is possible to provide an MRAM capable of suppressing electromigration in the via contacts V1a and having high reliability.

As a comparative example, a case is assumed in which each of the upper electrodes UE is commonly connected to two MTJ elements neighboring in the row direction and does not extend in the column direction. In this comparative example, the entire write current passing through the two MTJ elements neighboring in the row direction flows through one via contact V1b provided between the two MTJ elements in a concentrated manner. This increases the possibility of occurrence of electromigration in the via contact V1b.

On the other hand, in the first embodiment, the write current flows through the plurality of via contacts V1b in a dispersed manner as described above, thereby suppressing electromigration in the via contact V1a.

Further, the MRAM according to the first embodiment can be produced only by changing the mask layout of the upper electrodes UE of the comparative example. Accordingly, the MRAM according to the first embodiment can be easily produced at low cost with a small change of the production process.

In the first embodiment, each of the upper electrodes UE is commonly connected to all MTJ elements sharing the corresponding second bit line BL2 so as to reduce the resistance of each via contact V1b. That is, each of the upper electrodes UE is connected to all the via contacts V1b which are provided below the corresponding second bit line BL2. However, the upper electrodes UE do not necessarily have to extend the same length as the second bit lines BL2. That is, as long as the upper electrodes UE are connected to two or more via contacts V1b neighboring in the column direction, the upper electrodes UE do not necessarily have to be connected to all the via contacts V1b below the corresponding second bit line BL2. For example, even when the upper electrodes UE are configured to be connected to two via contacts V1b neighboring in the column direction, the effects of the first embodiment cannot be impaired.

Second Embodiment

Figure 5:
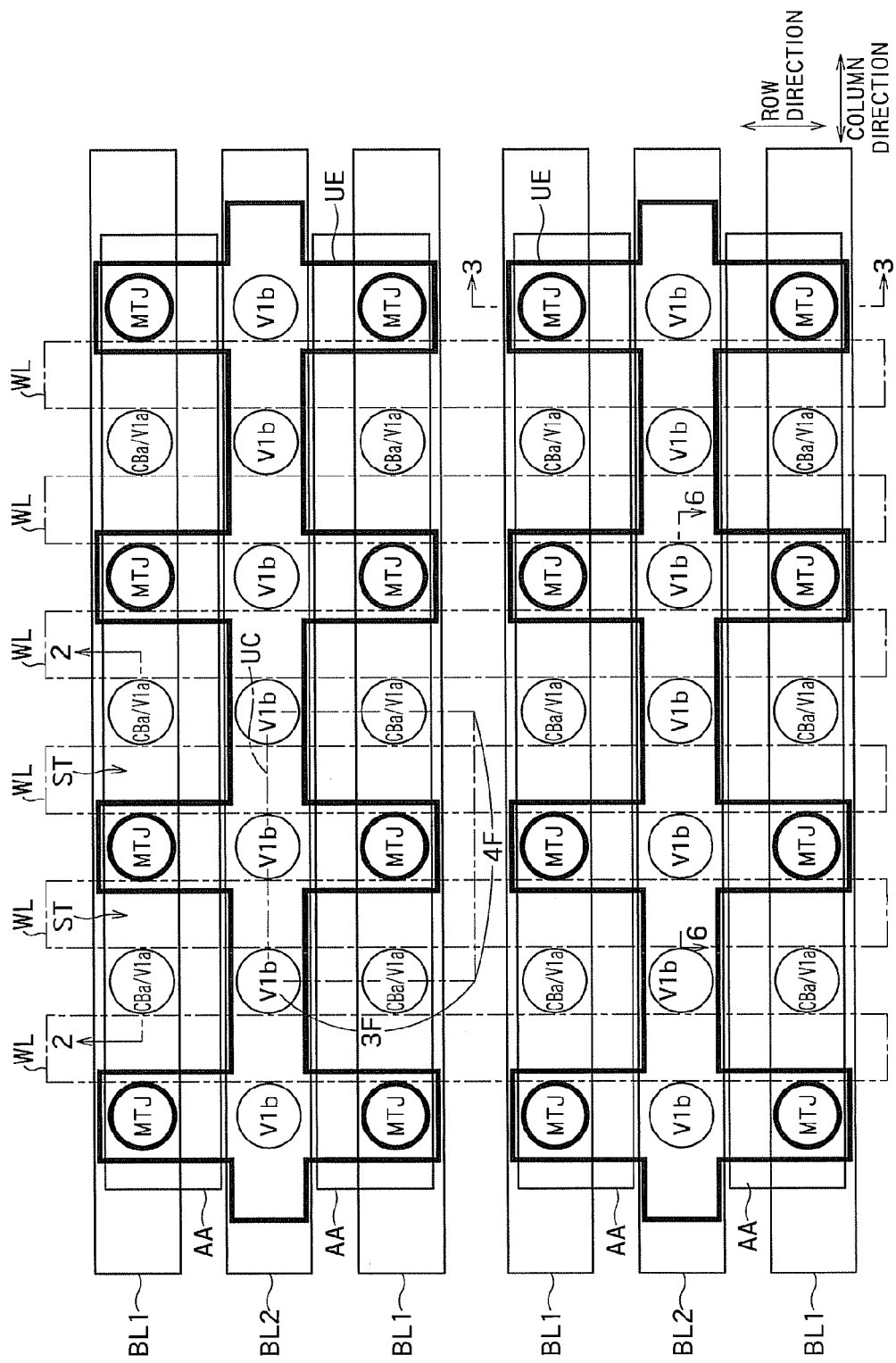
FIG. 5 is a partial plan view of a memory cell array of an MRAM according to a second embodiment.
Figure 6:
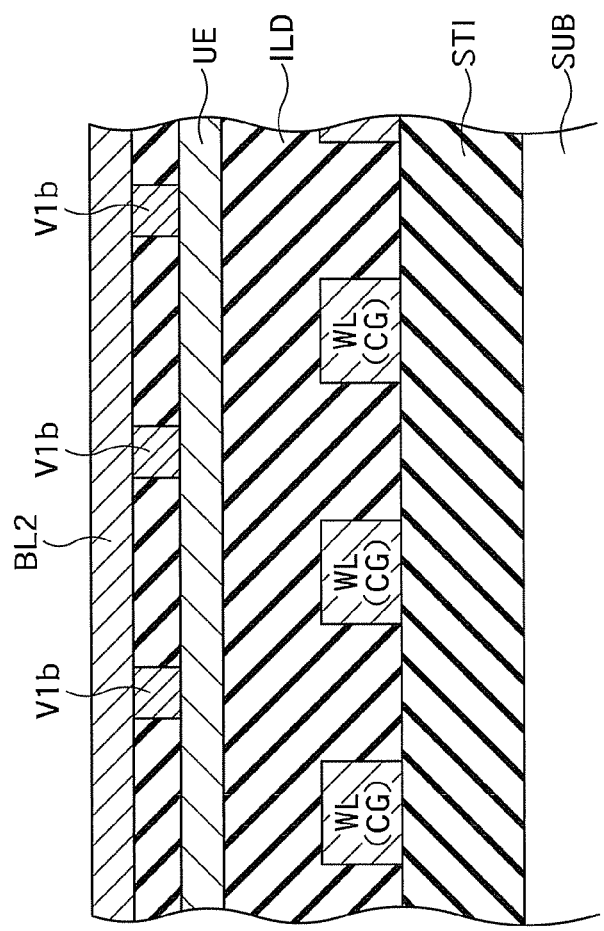
FIG. 6 is a sectional view taken along the line 6-6 of FIG. 5.

FIG. 5 is a partial plan view of a memory cell array of an MRAM according to a second embodiment. FIG. 6 is a sectional view taken along the line 6-6 of FIG. 5. The sectional view taken along the line 2-2 of FIG. 5 and the sectional view taken along the line 3-3 of FIG. 5 correspond to FIG. 2 and FIG. 3, respectively.

In the second embodiment, each of the via contacts V1b is provided not only between two adjacent MTJ elements neighboring in the row direction, but also between two contacts CBa/V1a neighboring in the row direction. That is, each of the via contacts V1a is provided between every pair of adjacent word lines WL in the plan view of the semiconductor substrate SUB viewed from the top. The other configuration of the second embodiment may be similar to the corresponding configuration of the first embodiment.

In this configuration, the density of the via contacts V1a increases, and the resistance between each upper electrode UE and each second bit line BL2 further decreases. The density of the via contacts V1a in the second embodiment is twice as large as that of the first embodiment, and the density of the current flowing through the via contacts V1a in the second embodiment is half that of the first embodiment. As a result, the second embodiment can more effectively suppress electromigration in the via contacts V1a. Further, the second embodiment can provide the same effects as those of the first embodiment.

Third Embodiment

Figure 7:
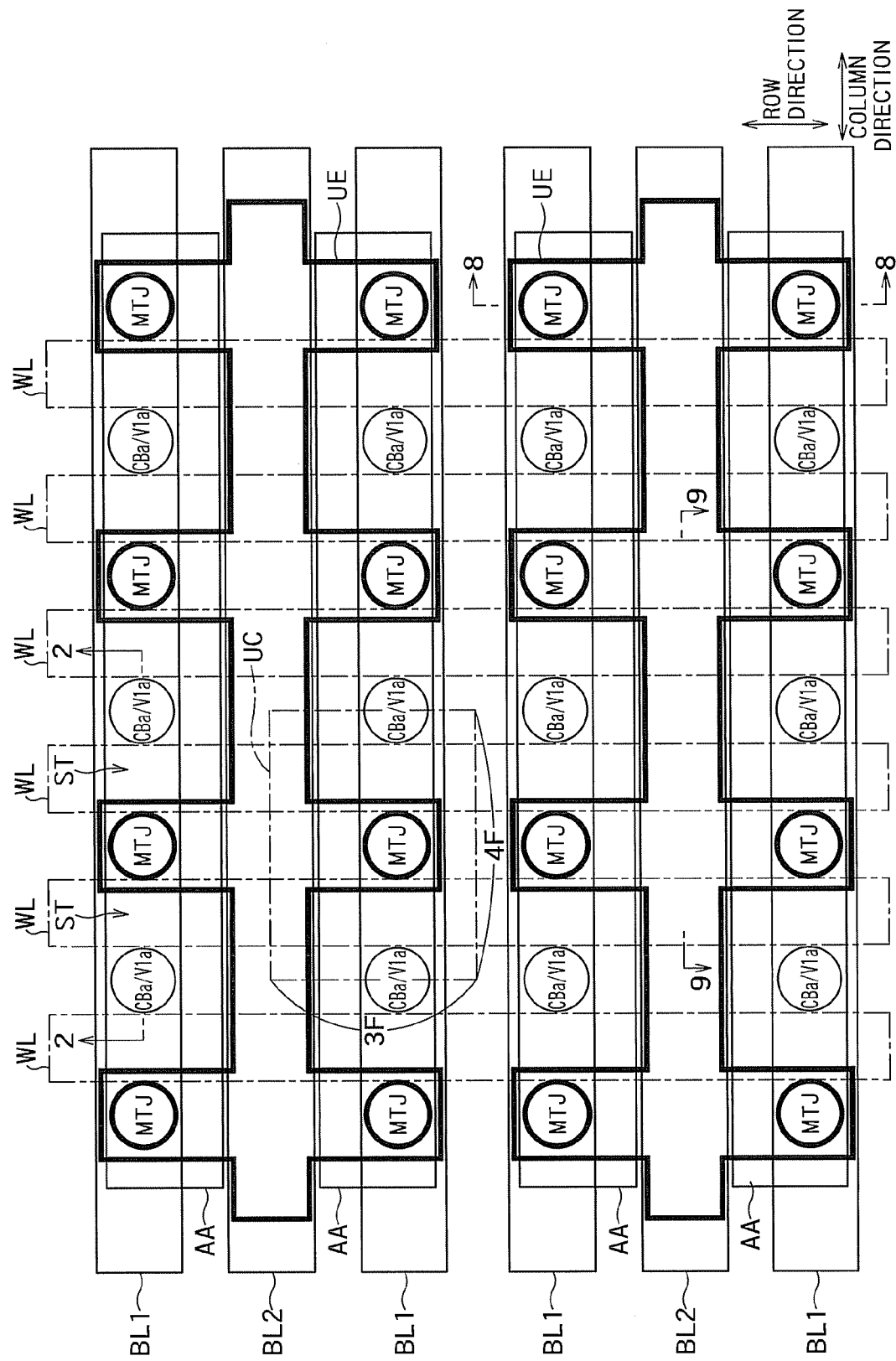
FIG. 7 is a partial plan view of a memory cell array of an MRAM according to a third embodiment.
Figure 8:
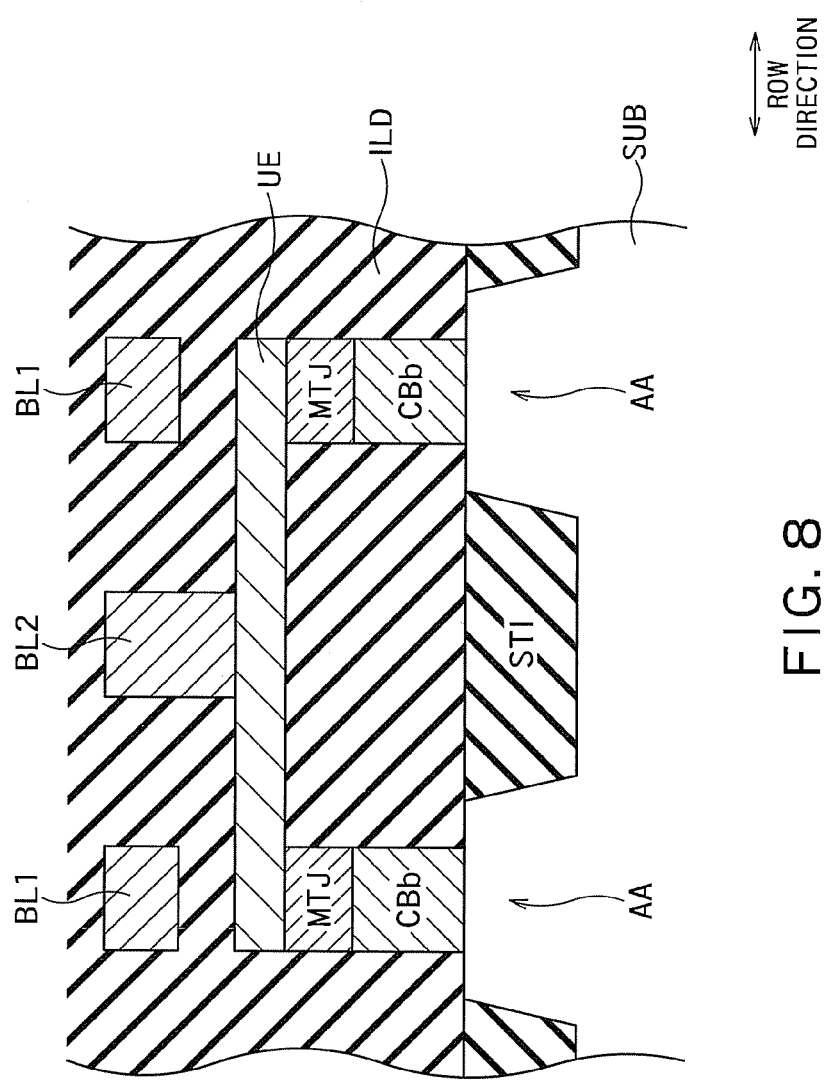
FIG. 8 is a sectional view taken along the line 8-8 of FIG. 5.
Figure 9:
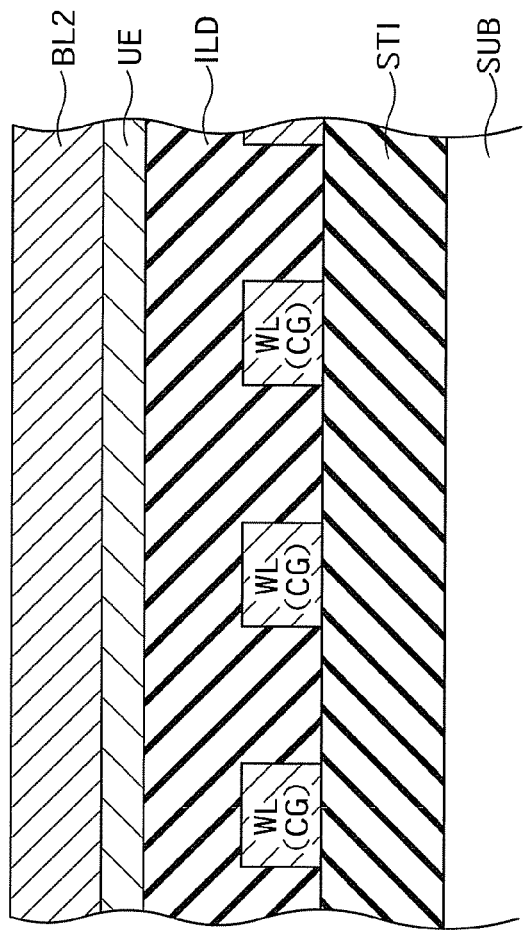
FIG. 9 is a sectional view taken along the line 9-9 of FIG. 5.

FIG. 7 is a partial plan view of a memory cell array of an MRAM according to a third embodiment. FIG. 8 is a sectional view taken along the line 8-8 of FIG. 5. FIG. 9 is a sectional view taken along the line 9-9 of FIG. 5. The sectional view taken along the line 2-2 of FIG. 5 corresponds to FIG. 2.

In the third embodiment, the second bit lines BL2 are buried by a damascene process so as to reach the upper electrodes UE. Accordingly, as shown in FIGS. 8 and 9, each second bit line BL2 is in direct contact with the entire upper surface of the corresponding upper electrode UE. The second bit lines BL2 and the upper electrodes UE are each formed as a two-layer interconnection. This eliminates the need for the via contacts V1a, and thus the via contacts V1a are not provided. The upper electrodes UE are integrally formed with the second bit lines BL2. In other words, the upper electrodes UE also function as the second bit lines BL2. The other configuration of the third embodiment may be similar to the corresponding configuration of the first embodiment.

In the third embodiment, each of the second bit lines BL2 is in direct contact with the entire upper surface of the corresponding upper electrode UE, and the second bit lines BL2 and the upper electrodes UE are each formed as a two-layer interconnection. Accordingly, the resistance between each second bit line BL2 and each upper electrode UE further decreases, so that the electromigration in the via contacts V1a can be completely eliminated. Further, the third embodiment can provide the same effects as those of the first embodiment.

Fourth Embodiment

Figure 10:
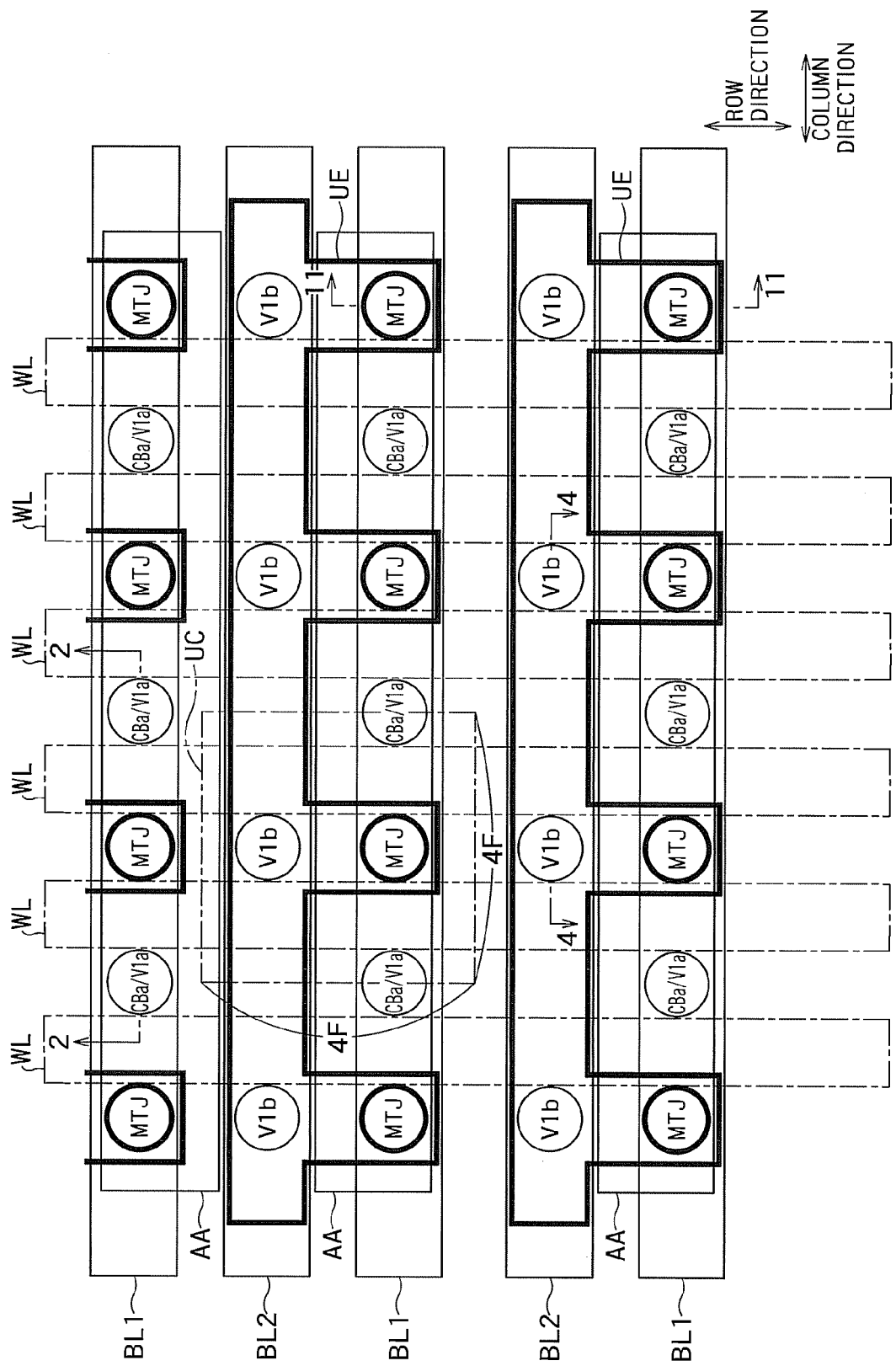
FIG. 10 is a partial plan view of a memory cell array of an MRAM according to a fourth embodiment.
Figure 11:
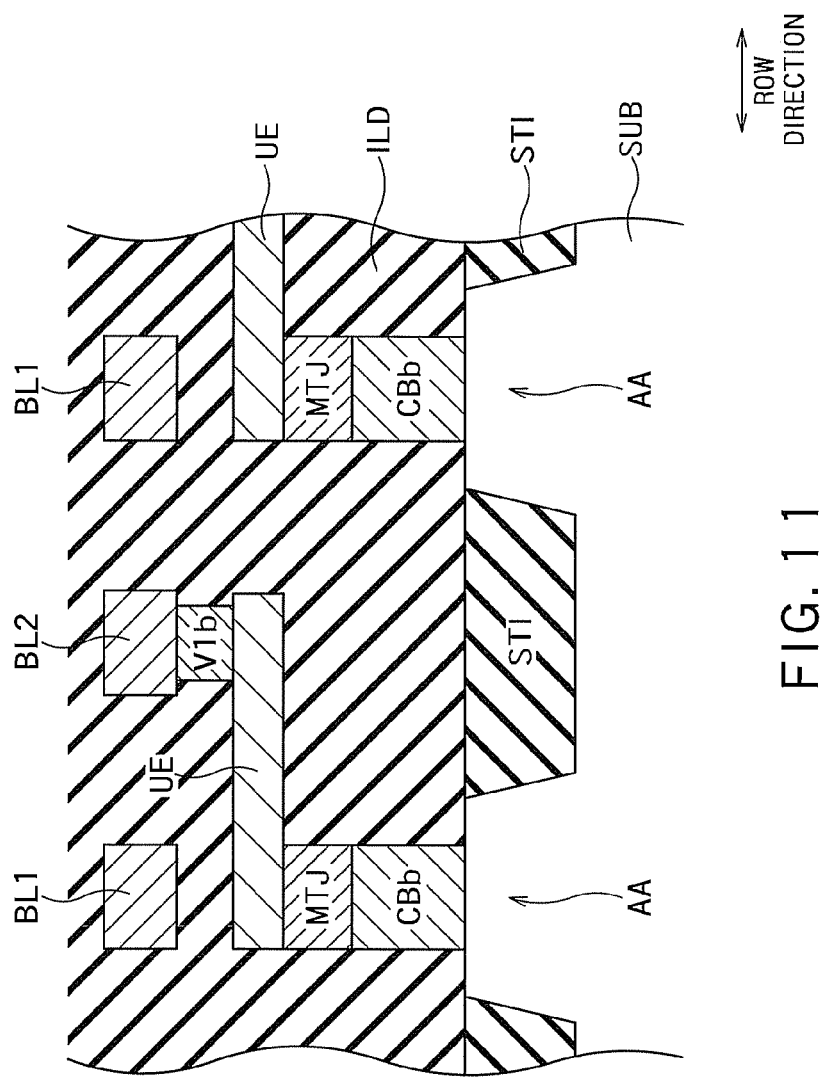
FIG. 11 is a sectional view taken along the line 11-11 of FIG. 10.

FIG. 10 is a partial plan view of a memory cell array of an MRAM according to a fourth embodiment. FIG. 11 is a sectional view taken along the line 11-11 of FIG. 10. The sectional view taken along the line 2-2 of FIG. 10 and the sectional view taken along the line 3-3 of FIG. 10 correspond to FIG. 2 and FIG. 3, respectively.

In the fourth embodiment, the second bit lines BL2 are provided to respectively correspond to the first bit lines BL1. That is, the first bit lines BL1 and the second bit lines BL2 are alternately arranged in the extending direction of the word lines WL. Each of the upper electrodes UE is commonly connected to the plurality of MTJ elements arranged in the extending direction (column direction) of the corresponding first bit line BL1 and the corresponding second bit line BL2. The upper electrodes UE are formed in a comb shape in the plan view.

The upper electrodes UE are electrically connected to the second bit lines BL2 via the via contacts V1b, as with the first embodiment. Accordingly, each of the via contacts V1b is commonly connected to the plurality of MTJ elements arranged in the column direction. In the fourth embodiment, however, each of the upper electrodes UE is not commonly connected to the MTJ elements neighboring in the row direction. In the fourth embodiment, the unit cell UC has a layout area of $16F^2$ (4F×4F).

In the MRAM according to the fourth embodiment, like the second bit lines BL2, each of the upper electrodes UE extends in the column direction and is commonly connected to the plurality of MTJ elements neighboring in the column direction. In addition, the upper electrodes UE are connected to the second bit lines BL2 via the plurality of via contacts V1b which are arranged in the column direction. Therefore, although each of the upper electrodes UE is not commonly connected to the MTJ elements neighboring in the row direction, the fourth embodiment can provide the same effects as those of the first embodiment.

In the fourth embodiment, the number of the via contacts V1a may be increased as in the second embodiment. Further, each of the second bit lines BL2 may be in direct contact with the entire surface of the corresponding upper electrode UE, as with the third embodiment. In short, the fourth embodiment may be combined with the second or third embodiment. Hence, the fourth embodiment can also provide the same effects as those of the second or third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a plurality of magnetic tunnel junction elements on a semiconductor substrate;
a plurality of selection transistors electrically connected to first ends of the magnetic tunnel junction elements, respectively;
a plurality of first bit lines connected to the first ends of the magnetic tunnel junction elements via one or more of the selection transistors, respectively;
a plurality of upper electrodes respectively connected to second ends of the magnetic tunnel junction elements;
a plurality of second bit lines respectively connected to the second ends of the magnetic tunnel junction elements via the upper electrodes; and
a plurality of via contacts electrically connected between the upper electrodes and the second bit lines,
wherein the upper electrodes extend along the second bit lines, and one of the upper electrodes is commonly connected to the second ends of the plurality of magnetic tunnel junction elements arranged in an extending direction of the second bit lines, and
one of the upper electrodes is connected to one of the second bit lines via the plurality of via contacts.

2. The device according to claim 1, wherein one of the upper electrodes is commonly connected to all the magnetic tunnel junction elements sharing the second bit lines.

3. The device according to claim 1, further comprising:
a plurality of via contacts arranged in the extending direction of the second bit lines between the upper electrodes and the second bit lines, and electrically connected to the upper electrodes and the second bit lines,
wherein the plurality of via contacts are shared by the magnetic tunnel junction elements arranged in the extending direction of the second bit lines.

4. The device according to claim 2, further comprising:
a plurality of via contacts configured to be arranged in the extending direction of the second bit lines between the upper electrodes and the second bit lines, and to electrically connect to the upper electrodes and the second bit lines,
wherein the plurality of via contacts are shared by the magnetic tunnel junction elements arranged in the extending direction of the second bit lines.

5. The device according to claim 3, wherein the plurality of via contacts are shared by the magnetic tunnel junction elements neighboring in a direction orthogonal to the second bit lines.

6. The device according to claim 1, wherein one of the upper electrodes is commonly connected to the plurality of magnetic tunnel junction elements neighboring in a direction orthogonal to the second bit lines.

7. The device according to claim 2, wherein one of the upper electrodes is commonly connected to the plurality of magnetic tunnel junction elements neighboring in a direction orthogonal to the second bit lines.

8. The device according to claim 3, wherein one of the upper electrodes is commonly connected to the plurality of magnetic tunnel junction elements neighboring in a direction orthogonal to the second bit lines.

9. The device according to claim 1, wherein the second bit lines are in direct contact with upper surfaces of the upper electrodes.

10. The device according to claim 2, wherein the second bit lines are in direct contact with upper surfaces of the upper electrodes.

11. The device according to claim 9, wherein the second bit lines and the upper electrodes are configured to be a two-layer interconnection.

12. The device according to claim 1, wherein
the second bit lines respectively correspond to the first bit lines, and
one of the upper electrodes is commonly connected to the plurality of magnetic tunnel junction elements arranged in the extending direction of the second bit lines.

13. The device according to claim 2, wherein
the second bit lines respectively correspond to the first bit lines, and
one of the upper electrodes is commonly connected to the plurality of magnetic tunnel junction elements arranged in the extending direction of the second bit lines.

14. The device according to claim 3, wherein
the second bit lines respectively correspond to the first bit lines, and
one of the upper electrodes is commonly connected to the plurality of magnetic tunnel junction elements arranged in the extending direction of the second bit lines.

15. The device according to claim 6, wherein
the second bit lines respectively correspond to the first bit lines, and
one of the upper electrodes is commonly connected to the plurality of magnetic tunnel junction elements arranged in the extending direction of the second bit lines.

16. The device according to claim 12, further comprising:
a plurality of via contacts configured to be arranged in the extending direction of the second bit lines between the upper electrodes and the second bit lines, and to electrically connect the upper electrodes and the second bit lines,
wherein the plurality of via contacts are shared by the plurality of magnetic tunnel junction elements arranged in the extending direction of the second bit lines.

17. The device according to claim 12, wherein the second bit lines are in direct contact with upper surfaces of the upper electrodes.

* * * * *